(12) United States Patent
Chung et al.

(10) Patent No.: US 10,711,958 B2
(45) Date of Patent: Jul. 14, 2020

(54) LED DEVICE AND LED LAMP USING THE SAME

(71) Applicant: SAMSUNG ELECTRONICS CO., LTD., Suwon-si (KR)

(72) Inventors: Jin Wook Chung, Yongin-si (KR); Chong Min Lee, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/161,948

(22) Filed: Oct. 16, 2018

(65) Prior Publication Data
US 2019/0346094 A1    Nov. 14, 2019

(30) Foreign Application Priority Data
May 9, 2018   (KR) .................. 10-2018-0053146

(51) Int. Cl.
| | | |
|---|---|---|
| H01L 33/62 | (2010.01) | |
| H01L 25/075 | (2006.01) | |
| H05K 1/18 | (2006.01) | |
| F21S 4/28 | (2016.01) | |
| F21V 29/70 | (2015.01) | |

(Continued)

(52) U.S. Cl.
CPC .............. *F21S 4/28* (2016.01); *F21V 19/001* (2013.01); *F21V 29/70* (2015.01); *H01L 25/0753* (2013.01); *H01L 33/62* (2013.01); *H05K 1/189* (2013.01); *F21Y 2115/10* (2016.08); *H05K 2201/10106* (2013.01)

(58) Field of Classification Search
CPC .............. H01L 21/565; H01L 23/3114; H01L 23/49513; H01L 33/502; H01L 33/42; H01L 33/06; H01L 33/007; H01L 33/50; H01L 2924/181; H01L 23/49827; H01L 23/3157; H01L 23/3017; H01L 33/52; F21Y 2115/10; H05K 2201/10106; F21S 41/141

See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |

(Continued)

FOREIGN PATENT DOCUMENTS

| | | |
|---|---|---|
| JP | 2001-127278 A | 5/2001 |
| JP | 2014-078575 A | 5/2014 |
| JP | 2015-159020 A | 9/2015 |

*Primary Examiner* — Caridad Everhart
(74) *Attorney, Agent, or Firm* — Sughrue Mion, PLLC

(57) ABSTRACT

A light emitting diode (LED) device includes: a transparent substrate having a first surface and a second surface opposite to the first surface; an LED array disposed on at least one of the first surface and the second surface of the transparent substrate, and including a plurality of LED chips electrically connected to one another; a controller disposed on at least one of the first surface and the second surface, and is electrically connected to the LED array to control the LED array; a connection terminal disposed at one end of the transparent substrate, and electrically connected to the LED array and the controller; and a wavelength converter covering the first surface and the second surface of the transparent substrate and the LED array.

20 Claims, 12 Drawing Sheets

(51) Int. Cl.
 *F21V 19/00* (2006.01)
 *F21Y 115/10* (2016.01)

(56) References Cited

U.S. PATENT DOCUMENTS

| | | | |
|---|---|---|---|
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,226,257 B2 | 7/2012 | Ye et al. | |
| 8,263,987 B2 | 9/2012 | Choi et al. | |
| 8,294,386 B2 | 10/2012 | Lee et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 2003/0063477 A1* | 4/2003 | Stepanenko | B29C 45/14811 362/546 |
| 2005/0276053 A1* | 12/2005 | Nortrup | F21V 19/001 362/294 |
| 2006/0187652 A1* | 8/2006 | Doyle | F21S 8/00 362/96 |
| 2009/0008459 A1* | 1/2009 | Mainguet | G06K 19/0716 235/492 |
| 2011/0149201 A1* | 6/2011 | Powell | G02F 1/133615 349/62 |
| 2012/0293086 A1 | 11/2012 | Ishikita et al. | |
| 2016/0154170 A1* | 6/2016 | Thompson | G02F 1/133603 362/609 |
| 2017/0188437 A1 | 6/2017 | Banta | |
| 2018/0005937 A1* | 1/2018 | Briggs | H01L 23/528 |
| 2018/0005947 A1* | 1/2018 | Kasturi | H01L 21/4853 |
| 2018/0020524 A1* | 1/2018 | Tylicki | H05B 33/0872 |

* cited by examiner

LED DEVICE AND LED LAMP USING THE SAME

CROSS-REFERENCE TO THE RELATED APPLICATION

This application claims priority from Korean Patent Application No. 10-2018-0053146 filed on May 9, 2018, with in the Korean Intellectual Property Office, the disclosure of which is incorporated herein by reference in its entirety.

BACKGROUND

1. Field

Apparatuses consistent with example embodiments of the inventive concept relate to a light emitting diode (LED) device and an LED lamp using the same.

2. Description of Related Art

In general, incandescent lamps or fluorescent lamps have been commonly used in indoor and outdoor lighting devices. However, a problem in which such incandescent lamps or fluorescent lamps may need to be frequently replaced due to a relatively short lifespan thereof is present.

To address such a problem, a lighting apparatus, including an LED, having characteristics such as excellent controllability, relatively high response speed, a relatively high photoconversion efficiency, a relatively long lifespan, a relatively low level of power consumption, and a relatively high degree of luminance, has been developed. In other words, since LEDs have a relatively high photoconversion efficiency, power consumption thereof is relatively low. In addition, since LEDs do not emit light through heating, preheating time is not required, thereby resulting in relatively high response speed in turning LEDs on and off.

In addition, LEDs are more shock-resistant, consume less power, a lifespan thereof is semi-permanent and may generate lighting effects of various colors, as compared to the incandescent lamps and fluorescent lamps of the related art. In addition, since LEDs use relatively small light sources, LEDs may be miniaturized, thereby expanding an application field of a lighting industry.

As such, as the application field of the lighting industry using LEDs has been expanded, various demands for LED lighting apparatuses have increased. Further, in addition to merely providing the same amount of light as lighting apparatuses of the related art using a lower level of power, demand for lighting apparatuses which are more cost competitive than lighting apparatuses of the related art has increased.

SUMMARY

Various aspects of the inventive concept provide an LED device and an LED lamp using the same which can be manufactures at reduced manufacturing costs.

According to an example embodiment, there is provided an LED device which may include: a transparent substrate having a first surface and a second surface opposite to the first surface; an LED array disposed on at least one of the first surface and the second surface of the transparent substrate, and including a plurality of LED chips electrically connected to one another; a controller disposed on at least one of the first surface and the second surface, and is electrically connected to the LED array to control the LED array; a connection terminal disposed at one end of the transparent substrate, and electrically connected to the LED array and the controller; and a wavelength converter covering the first surface and the second surface of the transparent substrate and the LED array.

According to an example embodiment, there is provided an LED lamp which may include: a bulb having an internal space; and at least one LED device disposed in the internal space, wherein the at least one LED device includes: a transparent substrate having a first surface and a second surface opposite to the first surface; an LED array disposed on at least one of the first surface and the second surface of the transparent substrate, and having a plurality of LED chips electrically connected to one another; a controller disposed on at least one of the first surface and the second surface and electrically connected to the LED array to control the LED array; a connection terminal disposed at at least one end of the transparent substrate and electrically connected to the LED array and the controller, wherein one area of the connection terminal is exposed to an outside of the bulb; and a wavelength converter covering the first surface and the second surface of the transparent substrate and the LED array.

According to an example embodiment, there is provided an LED lamp which may include: at least one LED device; and a light transmissive mold sealing the LED device, wherein the at least one LED device includes: a transparent substrate having a first surface and a second surface opposite to the first surface; an LED array disposed on at least one of the first surface and the second surface of the transparent substrate, and including a plurality of LED chips electrically connected to each other; a controller disposed on at least one of the first surface and the second surface, and is electrically connected to the LED array to control the LED array; a connection terminal disposed at at least one end of the transparent substrate, and electrically connected to the LED array and the controller, wherein one area of the connection terminal is exposed to an outside of the mold; and a wavelength converter covering the first surface and the second surface of the transparent substrate and the LED array.

BRIEF DESCRIPTION OF DRAWINGS

The above and other aspects, features, and advantages of the inventive concept will be more clearly understood from the following detailed description, taken in conjunction with the accompanying drawings, in which.

DETAILED DESCRIPTION

Hereinafter, example embodiments of the inventive concept will be described with reference to the accompanying drawings.

Figure 1:
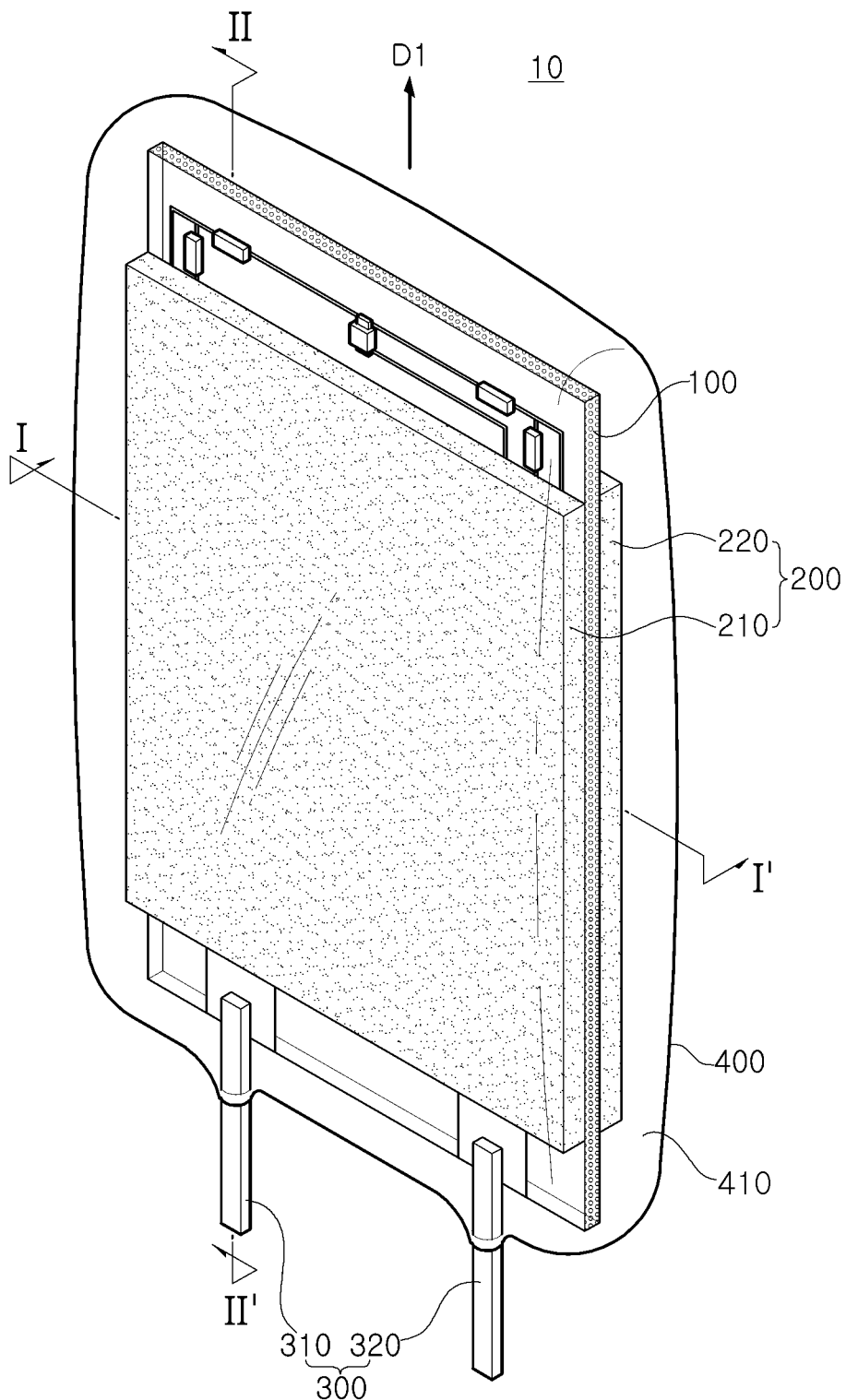
FIG. 1 is a perspective view of an LED lamp according to an example embodiment.
Figure 2:
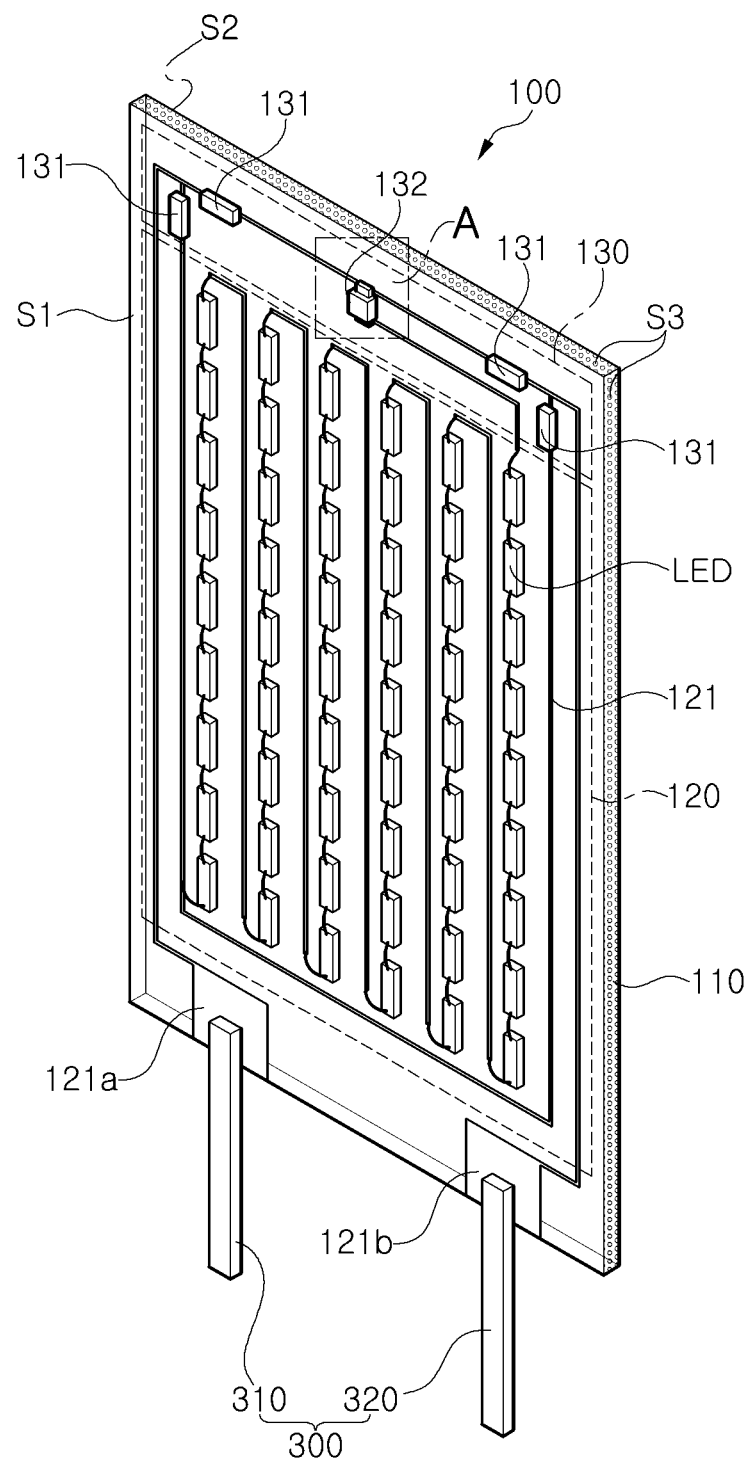
FIG. 2 is a perspective view of an LED device of FIG. 1 with a wavelength conversion unit removed, according to an example embodiment.

FIG. 1 is a perspective view of an LED lamp according to an example embodiment, and FIG. 2 is a perspective view of an LED device of FIG. 1 with a wavelength conversion unit removed, according to an example embodiment.

Referring to FIG. 1, an LED lamp 10 according to an example embodiment may include a bulb 400 and an LED device 100 accommodated and disposed in an internal space 410 of the bulb 400. While an example embodiment has been described by way of an example in which the LED device 100 is accommodated in the internal space of the bulb 400, the inventive concept is not limited thereto, and may be modified as the LED lamp 10 may be formed by molding the LED device 100 with a light transmissive resin. This will be described in another example embodiment.

The bulb 400 may be a transparent or frosted cover made of glass, hard glass, quartz glass, or a light transmissive resin. In addition, the bulb 400 may be a milky, matte, or colored cover. An end of the bulb 400 may be sealed through a high temperature heat treatment to form an internal space. Thus, the LED device 100 accommodated in the internal space of the bulb 400 may be shielded from external moisture. A gas such as helium gas or oxygen gas may be injected into the internal space of the bulb 400 before being sealed. A gas such as helium gas or oxygen gas may be injected into the internal space of the bulb 400 and then sealed. The bulb 400 may be provided as a bulb of a lighting device of the related art, such as an A-type, a G-type, an R-type, a PAR-type, a T-type, an S-type, a candle-type, a P-type, a PS-type, a BR-type an ER-type, or a BRL-type lighting device. In an example embodiment, the case in which the bulb 400 is a G9-type bulb will be described as an example.

The LED device 100 accommodated in the internal space of the bulb 400 includes a transparent substrate 110 having a first surface S1 and a second surface S2, opposite to each other, an LED array 120 disposed on the transparent substrate 110, a controller 130 and a connection terminal 300.

Referring to FIG. 2, the transparent substrate 110 may have a first surface S1 and a second surface S2 opposing the first surface S1, and may have a plate shape elongated in one direction, in other words, a bar shape. The transparent substrate 110 may be made of a light transmissive material such as glass, hard glass, quartz glass, transparent ceramic, sapphire, plastic, or the like. According to example embodiments, the transparent substrate 110 may be a flexible substrate using a material such as a polyimide resin or the like. Therefore, to bend the transparent substrate 110 into a cylindrical shape or a U-type is also possible, such that the first surface S1 on which at least one LED chip is mounted is disposed externally. A side surface S3 connecting the first surface S1 and the second surface S2 of the transparent substrate 110 may have a concave-convex pattern to improve light extraction efficiency of light incident into the transparent substrate 110.

An LED array 120, which includes at least one LED chip, and the controller 130 controlling the LED array 120 may be disposed on the first surface S1 of the transparent substrate 110. According to example embodiments, the LED array 120 may be disposed on both the first surface S1 and the second surface S2. In addition, the LED array 120 may be disposed on the first surface S1 and the controller 130 may be disposed on the second surface S2. In addition, while FIG. 2 illustrates that the LED array 120 is disposed to be in contact with one end of the transparent substrate 110 on which a connection terminal 300 is disposed, the present inventive concept is not limited thereto, and the controller 130 may be disposed to be in contact with one end of the transparent substrate 110 on which the connection terminal 300 is disposed.

A printed circuit pattern 121 for constituting the LED array 120 and the controller 130 may be disposed on the first surface S1 and/or the second surface S2 of the transparent substrate 110. The printed circuit pattern 121 may be used as a wiring for mounting the LED chip of the LED array 120 and semiconductor chips of the controller 130 on the transparent substrate 110. According to example embodiments, the printed circuit pattern 121 may be formed of a light transmissive electrode and light emitted from the LED chip mounted on the first surface S1 is transmitted through the printed circuit pattern 121 to be emitted to the second surface S2 of the transparent surface S2. Such a light transmissive electrode may be either a transparent conductive oxide layer or a nitride layer. For example, the light transmissive electrode may be at least one selected from Indium Tin Oxide (ITO), Zinc-doped Indium Tin Oxide (ZITO), Zinc Indium Oxide (ZIO), Gallium Indium Oxide (GIO), Zinc Tin Oxide (ZTO), Fluorine-doped Tin Oxide (FTO), Aluminum-doped Zinc Oxide (AZO), Gallium-doped Zinc Oxide (GZO), $In_4Sn_3O_{12}$ and $Zn_{(1-x)}Mg_xO$ (Zinc Magnesium Oxide, $0 \leq x \leq 1$). According to example embodiments, the printed circuit pattern 121 may be made of a material such as copper (Cu), silver (Ag), nickel (Ni), aluminum (Al), rhodium (Rh), palladium (Pd), iridium (Ir), ruthenium (Ru), magnesium (Mg), zinc (Zn), platinum (Pt), gold (Au), or the like. One area of the printed circuit pattern 121 may be used as connectors 121a and 121b for connecting the connection terminal 300 for applying power, the connectors 121a and 121b may be disposed at one end of the transparent substrate 110.

The LED array 120 is an area on which the LED chip is mounted, and one or LED chips may be mounted. According to example embodiments, a plurality of LED chips may be electrically connected and mounted in series, parallel or series-parallel. In an example embodiment, the case on which the plurality of LED chips are mounted will be described as an example.

Referring to FIG. 2, the plurality of LED chips may be disposed on the transparent substrate 110 in a longitudinal direction (a direction of D1 of FIG. 1) of the transparent substrate 110. However, the inventive concept is not limited thereto, and the plurality of LED chips may be disposed in a width direction of the transparent substrate 110 according to example embodiments.

Figure 7:
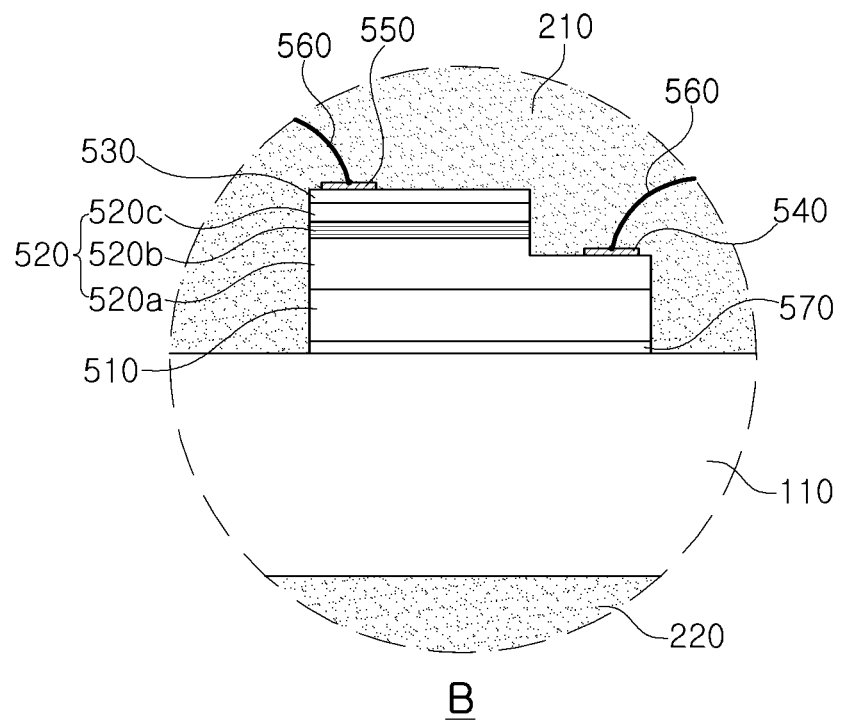
FIG. 7 is an enlarged view of portion B of FIG. 6, according to an example embodiment.

Referring to FIG. 7, the plurality of LED chips may be connected in series via a wire 560. However, the inventive concept is not limited thereto, as described above, the plurality of LED chips may be connected in series, parallel or series-parallel. The LED chips may be directly mounted on the transparent substrate 110 in a form of a chip on board (COB) without a separate package.

Referring to FIG. 7, the plurality of LED chips may include a light emitting structure 520 including a first conductive semiconductor layer 520a, an active layer 520b as a multiple quantum well structure and a second conductive semiconductor layer 520c, sequentially disposed on a light transmissive substrate 510, respectively.

The light transmissive substrate 510 may use a semiconductor growth substrate made of a material such as sapphire, SiC, MgAl$_2$O$_4$, MgO, LiAlO$_2$, LiGaO$_2$, GaN, and the like. In this case, the sapphire is a crystal having hexagonal-rhombo (Hexa-Rhombo R3c) symmetry and lattice constants in a c-axis and an axis directions are 13.00 Å and 4.76 Å, respectively, and may have C(0001) plane, A(11-20) plane, R(1-102) plane, and the like. In this case, since a nitride thin film may be relatively easily grown on the C plane, stable at relatively high temperature, the C plane is commonly used as a nitride growth substrate.

The light transmissive substrate 510 may have surfaces opposite to each other, and a concave-convex structure may be formed on at least one of opposite surfaces thereof. The concave-convex structure may be provided by etching a portion of the light transmissive substrate 510 or by forming a hetero material layer, different from the light transmissive substrate 510.

The first conductive semiconductor layer 520a may be provided as a nitride semiconductor satisfying n-type Al$_x$In$_y$Ga$_{1-x-y}$N (0≤x<1, 0≤y<1, 0≤x+y<1), while an n-type impurity may be provided as silicon (Si). The second conductive semiconductor layer 520c may be provided as a nitride semiconductor layer satisfying p-type Al$_x$In$_y$Ga$_{1-x-y}$N (0≤x<1, 0≤y<1, 0≤x+y<1), while a p-type impurity may be provided as magnesium (Mg). For example, the first conductive semiconductor layer 520a may include n-type GaN, and the second conductive semiconductor layer may include p-type GaN. In addition, the second conductive semiconductor layer 520c may be implemented to have a single layer structure. However, according to need, the second conductive semiconductor layer 520c may have a multilayer structure including different compositions.

The active layer 520b may have an MQW structure in which a quantum well layer and a quantum barrier layer are alternatively stacked. For example, the quantum well layer and the quantum barrier layer may be provided as Al$_x$In$_y$Ga$_{1-x-y}$N (0≤x≤1, 0≤y≤1, 0≤x+y≤1) having different compositions. In a specific example, the quantum well layer 16a may be provided as In$_x$Ga$_{1-x}$N (0<x≤1), while the quantum barrier layer 16b may be provided as GaN or AlGaN.

The LED chip may include a first electrode 540 disposed on the first conductive semiconductor layer 520a, an ohmic contact layer 530 and a second electrode 550, sequentially disposed on the second conductive semiconductor layer 520.

The first electrode 540 and the ohmic contact layer 530 may include a material, such as silver (Ag), nickel (Ni), aluminum (Al), rhodium (Rh), palladium (Pd), iridium (Ir), ruthenium (Ru), magnesium (Mg), zinc (Zn), platinum (Pt), gold (Au), and the like, and may be employed to have a single layer structure or a multilayer structure, but are not limited thereto. The second electrode 550 may be provided as a contact electrode layer and may include chromium (Cr)/gold (Au).

The ohmic contact layer 530 may be implemented variously, according to a chip structure. For example, in a case in which the LED chip has a flip-chip structure, the ohmic contact layer 530 may include Ag. In a case of a structure disposed in an opposite manner to the flip-chip structure, the ohmic contact layer 530 may include a light transmissive electrode. The light transmissive electrode may be provided as either a transparent conductive oxide layer or a nitride layer. For example, the light transmissive electrode may be provided as at least one selected from among Indium Tin Oxide (ITO), Zinc-doped Indium Tin Oxide (ZITO), Zinc Indium Oxide (ZIO), Gallium Indium Oxide (GTO), Zinc Tin Oxide (ZTO), Fluorine-doped Tin Oxide (FTO), Aluminum-doped Zinc Oxide (AZO), Gallium-doped Zinc Oxide (GZO), In$_4$Sn$_3$O$_{12}$ and Zn$_{(1-x)}$Mg$_x$O (Zinc Magnesium Oxide, 0≤x≤1). The ohmic contact layer 530 may include graphene, according to need. The second electrode 550 may include Au, Sn or Au/Sn.

The LED chip may be attached to the transparent substrate 110 through a bonding layer 570. The bonding layer 570 may be formed of a material having relatively high thermal conductivity such that heat generated by the LED chip may be rapidly transmitted to the transparent substrate 110. Specifically, a transparent silicone adhesive, an adhesive containing a thermally conductive metal filler, or the like may be used on the bonding layer 570, and an Ag paste may be also used. Thus, since heat of the LED chip is quickly dissipated, while light emitted from the LED chip is transmitted, reliability of the LED chip may be increased. An alumina filler may be used as the metal filler, but the inventive concept is not limited thereto.

Figure 8:
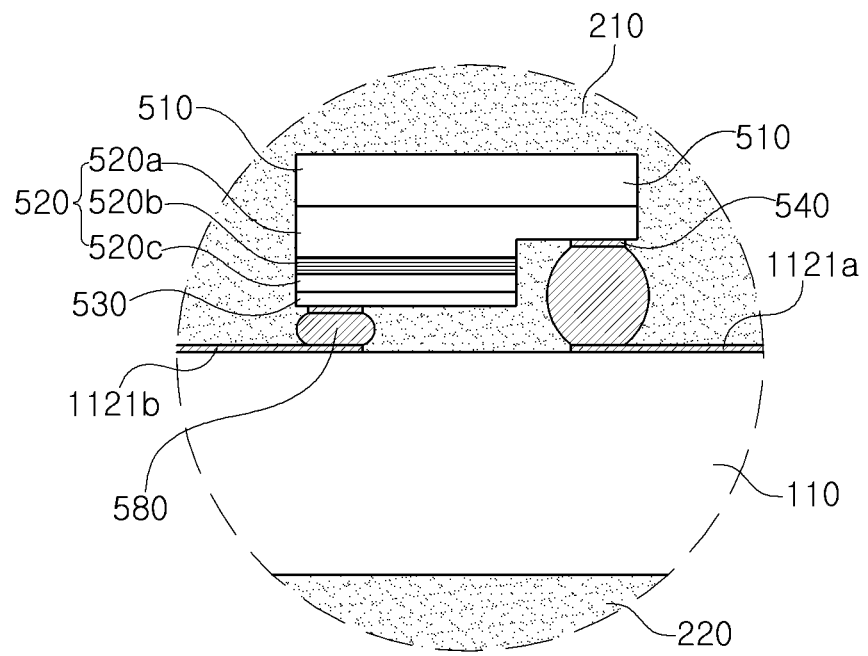
FIG. 8 is a modified example of an LED chip of FIG. 7, according to an example embodiment.

In addition, as illustrated in FIG. 8, the LED chip may be mounted on printed circuit patterns 1121a and 1121b of the transparent substrate 110 in a form of a flip-chip in which first and second electrodes 530 and 540 are attached to a solder 580.

Referring to FIG. 2, first and second connection terminals 310 and 320 for applying power to the LED array 120 and the controller 130 may be connected to connectors 121a and 121b of the printed circuit pattern 121.

The controller 130 may include various circuits for controlling the LED array 120. For example, the controller 130 may include an alter gating current) direct current (AC/DC) rectifier circuit for supplying DC power to the LED array 120. In addition, the controller 130 may further include various control circuits such as a motion sensing circuit sensing a movement of a user using a RADAR device, a voice recognition circuit for recognizing a user's voice to convert the voice into an electrical signal, an optical sensor circuit, or the like. In an example embodiment, the case in which the controller 130 is formed of an AC/DC rectifier circuit including four diodes 131 and one constant current diode 132 will be described as an example.

Since the controller 130 may be disposed on a single transparent substrate 110 together with the LED array 120, manufacturing costs may be reduced compared with the case in which the LED array 120 and the controller 130 are disposed on separate substrates. Further, since the controller 130 uses the single transparent substrate 110, as compared with the case in which the LED array 120 and the controller 130 are disposed on separate substrates, the LED array 120 may be widely disposed in a limited internal space of the bulb 400. Thus, the light amount of the LED lamp 10 may be further increased.

Figure 3:
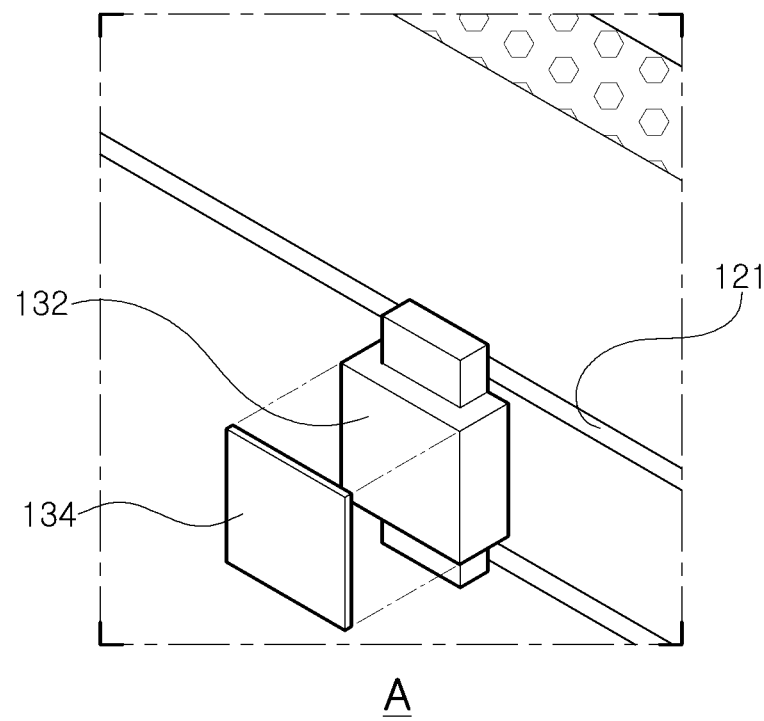
FIG. 3 is an enlarged view of portion A of FIG. 2, according to an example embodiment.

The controller 130 may include a semiconductor chip constituting an AC/DC rectifier circuit, a motion sensing circuit or a voice recognition circuit. A reflective layer 134 may be disposed on the surface of the semiconductor chip to prevent light from being absorbed on the surface of the semiconductor chip. For example, FIG. 3 illustrates that the reflective layer 134 is disposed on the surface of the constant current diode 132, one of the semiconductor chips included in the controller 130. The reflective layer 134 may be formed by forming a resin containing a reflective material such as TiO$_2$ into a sheet shape and attaching the resin to a semiconductor chip, or by applying a resin in which the reflective material is dispersed on the surface of the semiconductor chip.

Figure 4:
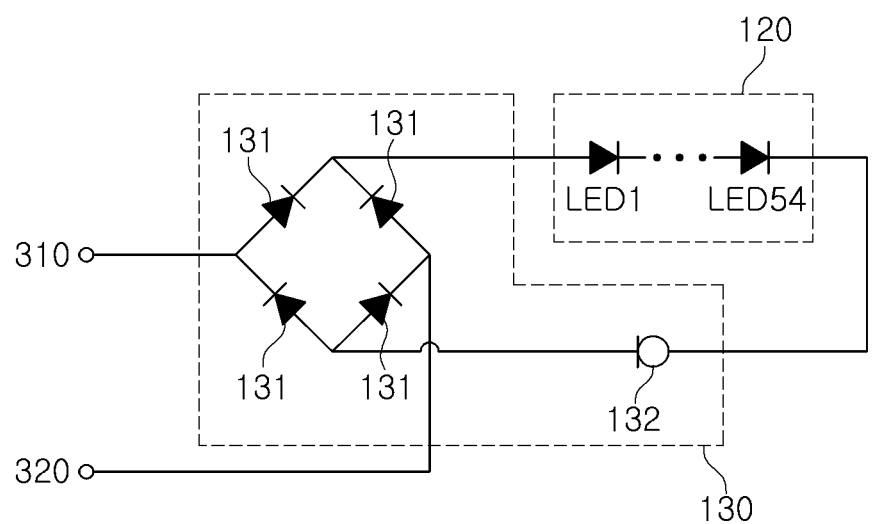
FIG. 4 is a circuit diagram of an LED unit and a control unit of FIG. 2, according to an example embodiment.

FIG. 4 is a circuit diagram of the LED device 100, according to FIG. 4, the LED array 120 includes 54 LED chips LED1 to LED54 connected in series to one another, and the controller 130 is formed of an AD/DC rectifier circuit including four diodes 131 and one constant current diode 132.

Referring to FIG. 1, a wavelength converter 200 may include a first wavelength converter 210 and a second wavelength converter 220 covering a first surface S1 and a second surface S2 of the transparent substrate 110, respectively. The wavelength converter 200 may convert a wavelength of light emitted from the LED chip. The wavelength converter 200 may be limitedly disposed on the LED array 120 except the controller 130. Accordingly, the wavelength converter 200 is prevented from unnecessarily being disposed on the controller 130, thereby improving heat efficiency of the controller 130 and preventing unnecessarily being disposed of the expensive wavelength converter 200, and the manufacturing costs may be reduced. In addition, by limitedly disposing the wavelength converter 200 only on the LED array 120 except the controller 130, it is possible to prevent the signal received by the controller 130 from being interfered with.

The wavelength converter 200 may be formed to cover the surfaces of the transparent substrate 110 and the LED chip by mixing a phosphor, a quantum dot, or the like in a semi-cured resin material. The wavelength converter 200 may be a B-stage composite material in which the phosphor is mixed with a polymer binder made of a resin, a curing agent, a curing catalyst and the like and is semicured.

As the phosphor, a garnet-based phosphor (YAG, TAG, LuAG), a silicate-based phosphor, a nitride-based phosphor, a sulfide-based phosphor, an oxide-based phosphor, and the like may be used, the phosphor may include a single species or a plurality of species mixed at a predetermined ratio.

The resin used in the wavelength converter 200 may be an epoxy-based or silicone, an inorganic polymer, a resin capable of satisfying requirements for high adhesiveness, high light transmittance, high heat resistance, high refractive index, moisture resistance, and the like. For securing high adhesiveness, as an additive for improving adhesiveness, for example, a silane-based material may be employed.

The wavelength converter 200 may be formed in various ways. For example, a resin containing a phosphor may be formed in a sheet form and cut the resin and attached thereto, or a resin containing a phosphor may be discharged through a nozzle on the transparent substrate 110 on which the LED chip is mounted to form a first wavelength converter 210, and a resin containing a phosphor may be discharged through a nozzle, again to form a second wavelength converter 220.

Figure 5A:
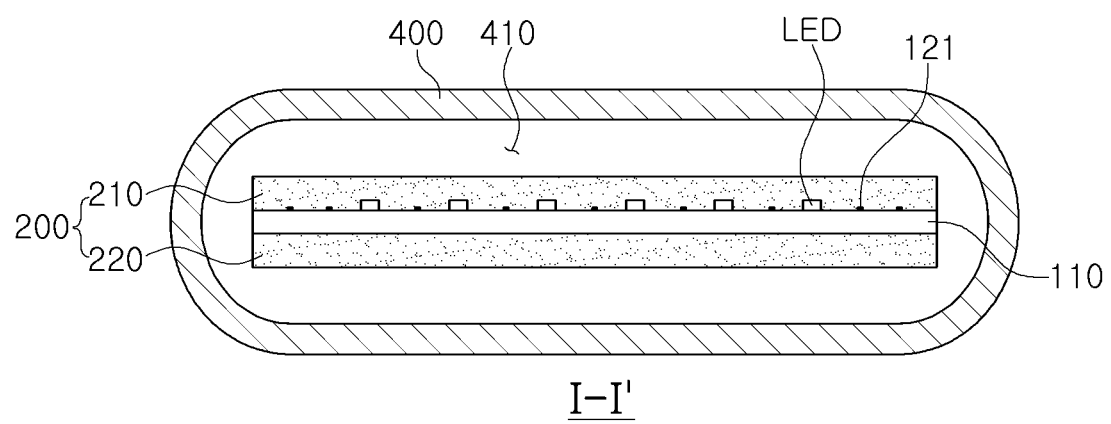
FIG. 5A is a cross-sectional view taken along the line I-I' of FIG. 1, according to an example embodiment.

FIG. 5A illustrates the sheet-shaped first and second wavelength converters 210 and 220 disposed on both sides of the transparent substrate 110, respectively.

Figure 5B:
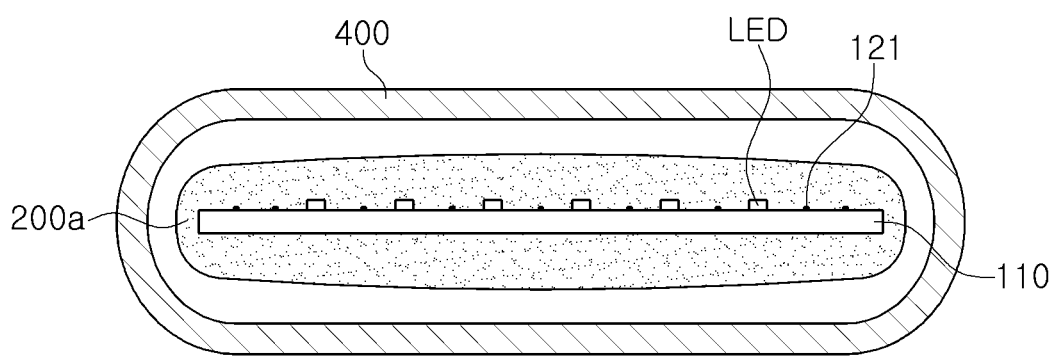
FIGS. 5B, 5C and 5D are modified examples of FIG. 5A, according to an example embodiment.
Figure 5C:
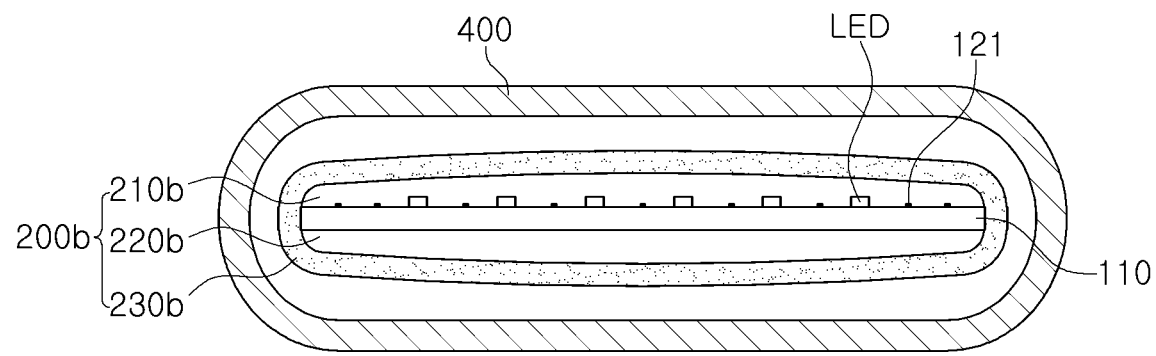
Figure 5D:
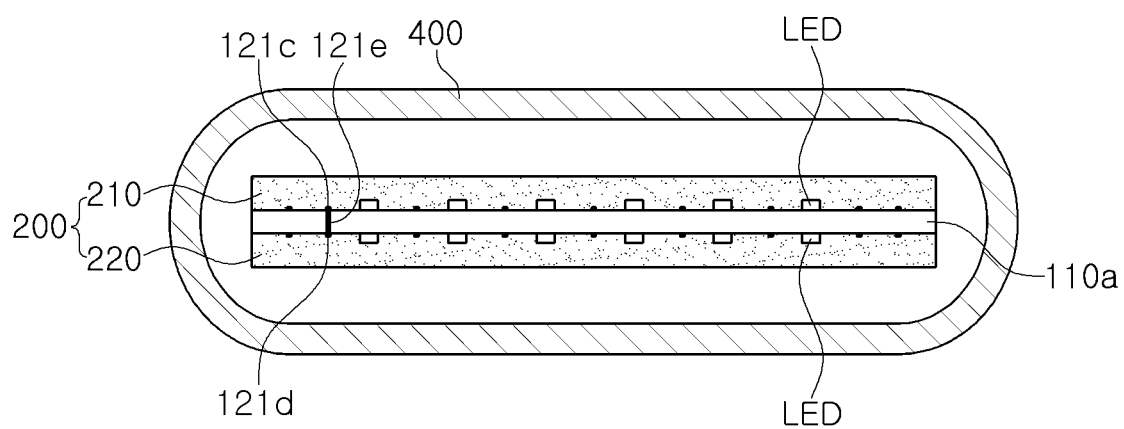
Figure 6:
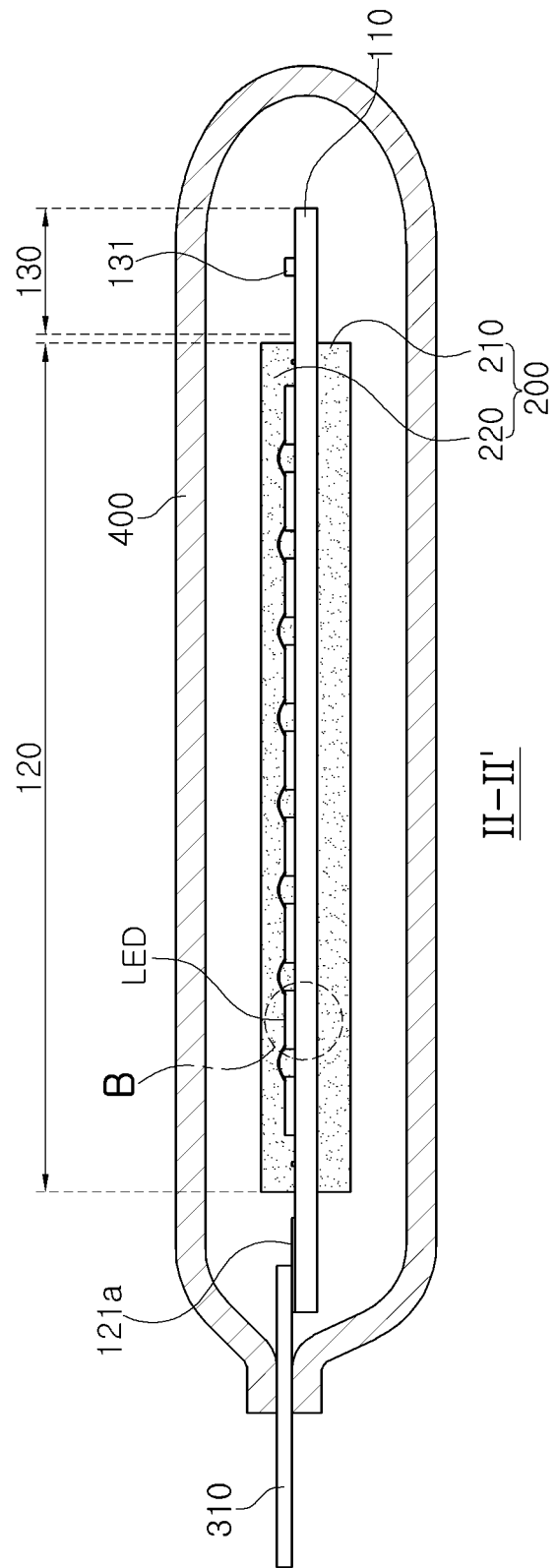
FIG. 6 is a cross-sectional view taken along the line II-II' of FIG. 1, according to an example embodiment.

FIGS. 5B to 5D are various modified examples of the wavelength converter 200. The same configuration is omitted to avoid duplication of explanation.

FIG. 5B is an example in which a wavelength converter 200a is formed by dispensing such that the wavelength converter 200a covers not only both surfaces and a side surface of the transparent substrate 110.

FIG. 5C is an example in which a wavelength converter 230b is spaced apart from the LED chip, by forming transparent resin layers 210b and 220b on both surfaces of the transparent substrate 110, respectively, and a wavelength converter 230b through dispensing to cover the transparent resin layers 210b and 220b.

FIG. 5D is an example in which the LED chips are mounted on both surfaces of a transparent substrate 110a, respectively, and a via 121e is formed to penetrate both surfaces of the transparent substrate 110a and printed circuit patterns 121c and 121d disposed on both surfaces of the transparent substrate 110a, respectively, are electrically connected to each other.

Figure 9:
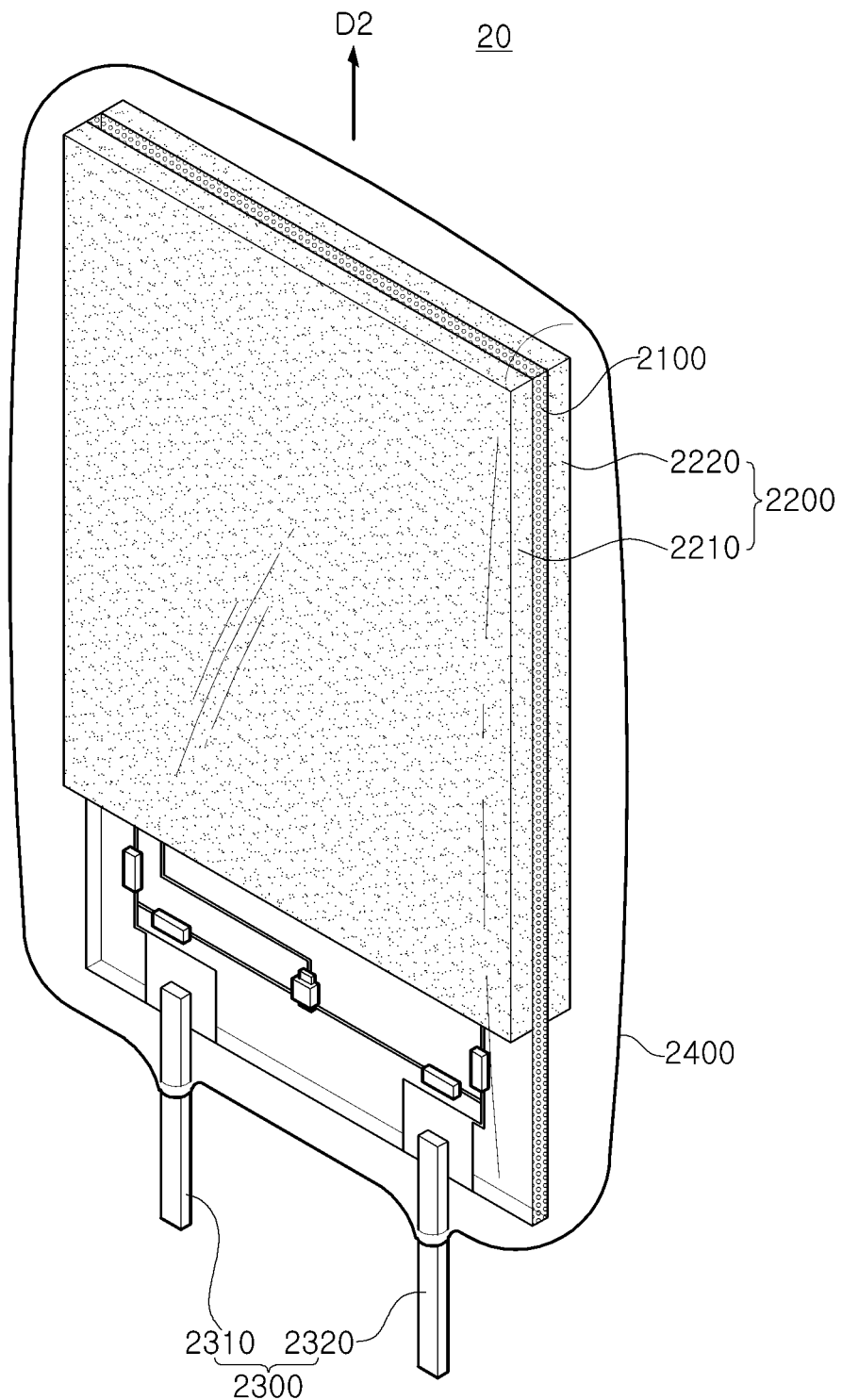
FIGS. 9 and 10 are modified examples of FIGS. 1 and 2, according to an example embodiment.
Figure 10:
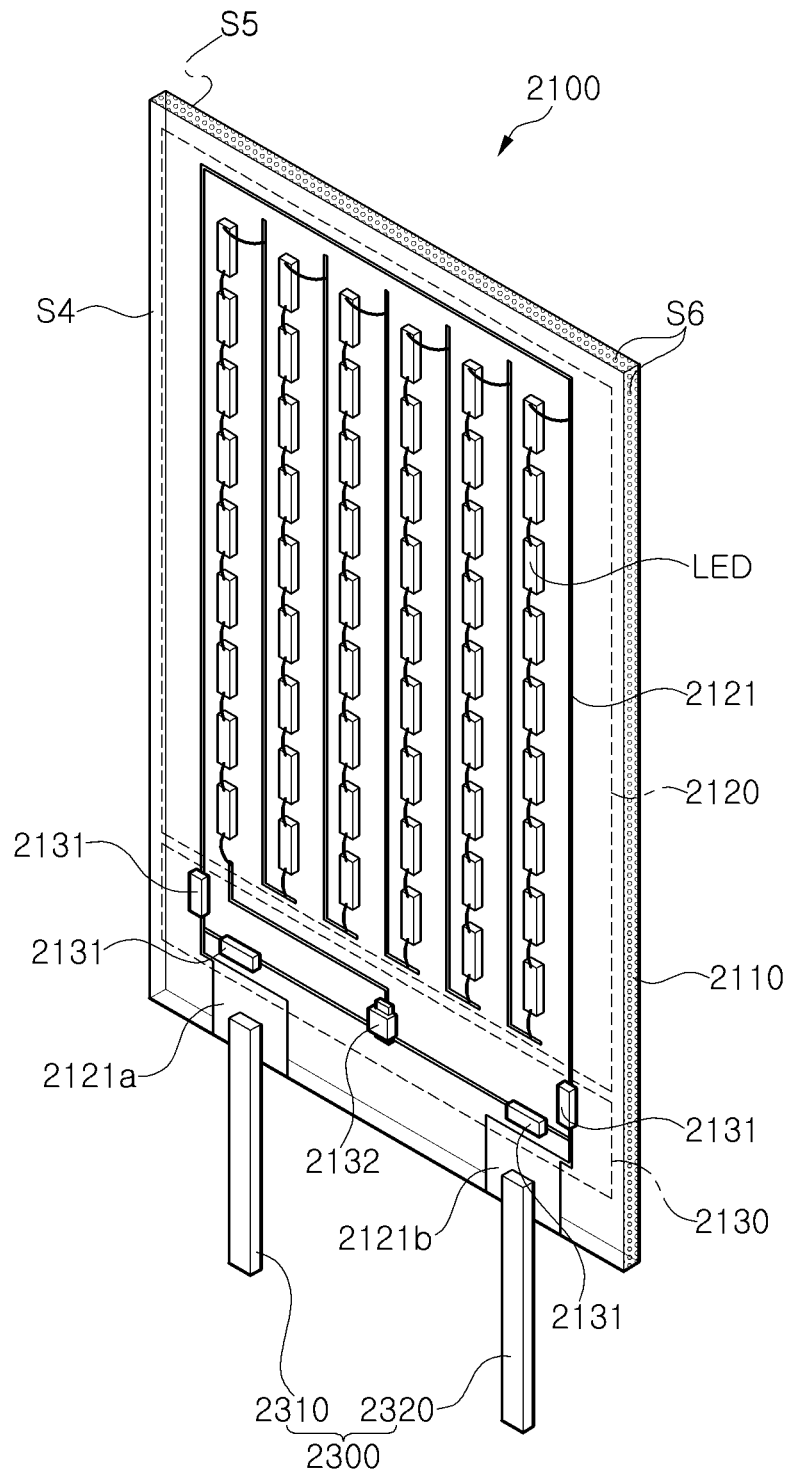

FIGS. 9 and 10 are modified examples of FIGS. 1 and 2, unlike an above-described example embodiment, a controller 2130 is formed to be disposed to be in contact with one end of a transparent substrate 2110 on which a connection terminal 2300 is disposed.

An LED lamp 20 includes an LED device 2100 and a bulb 2400, the connection terminal 2300 is disposed at one end of the LED device 2100, and the connection terminal 2300 includes first and second connection terminals 2310 and 2320, the same as above-described example embodiments, and thus a detailed description thereof will be omitted.

In addition, the LED device 2100 includes a transparent substrate 2110, the transparent substrate 2110 includes a first surface S4, a second surface S5 and a side surface S6, an LED array 2120 and a controller 2130 are disposed on the first substrate S4, the LED array 2120 includes a plurality of LED chips, and the plurality of LED chips are disposed in a longitudinal direction of the transparent substrate (D2 direction of FIG. 9), the same as the above-described example embodiment, and thus a detailed description will be omitted.

A printed circuit pattern 2121 for constituting the LED array 2120 and the controller 2130 is disposed on the first surface S4 of the transparent substrate 110, and connectors 2121a and 2121b are disposed at one end of the printed circuit pattern 2121 for connecting a connection terminal 2300, and a controller 2130 is an AC/DC rectifier circuit including four diodes 2131 and one constant current diode 2132, also the same as the above-described example embodiment, and thus a detailed description will be omitted.

Figure 11:
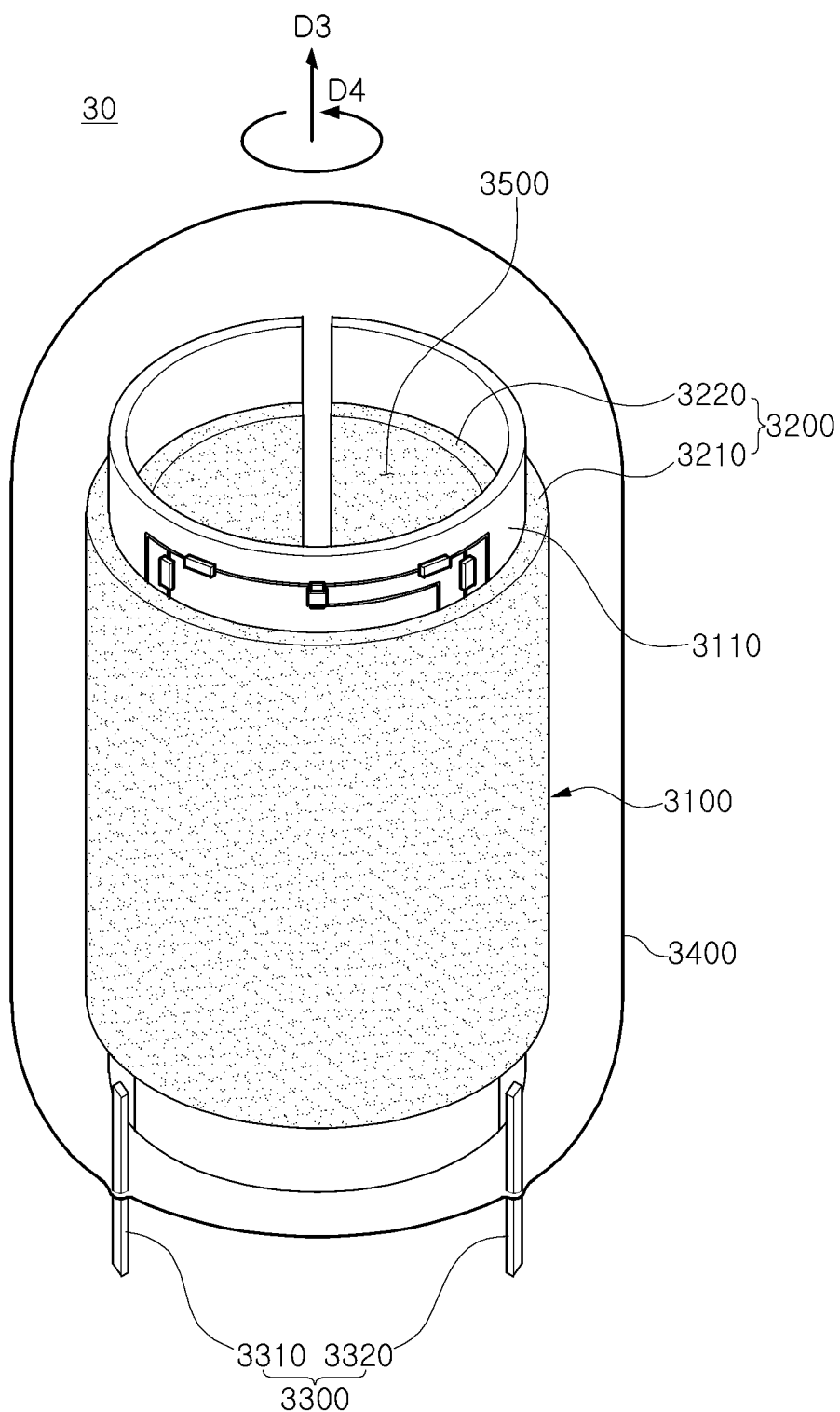
FIGS. 11 to 13 are modified examples of an LED lamp of FIG. 1, according to example embodiments.
Figure 12:
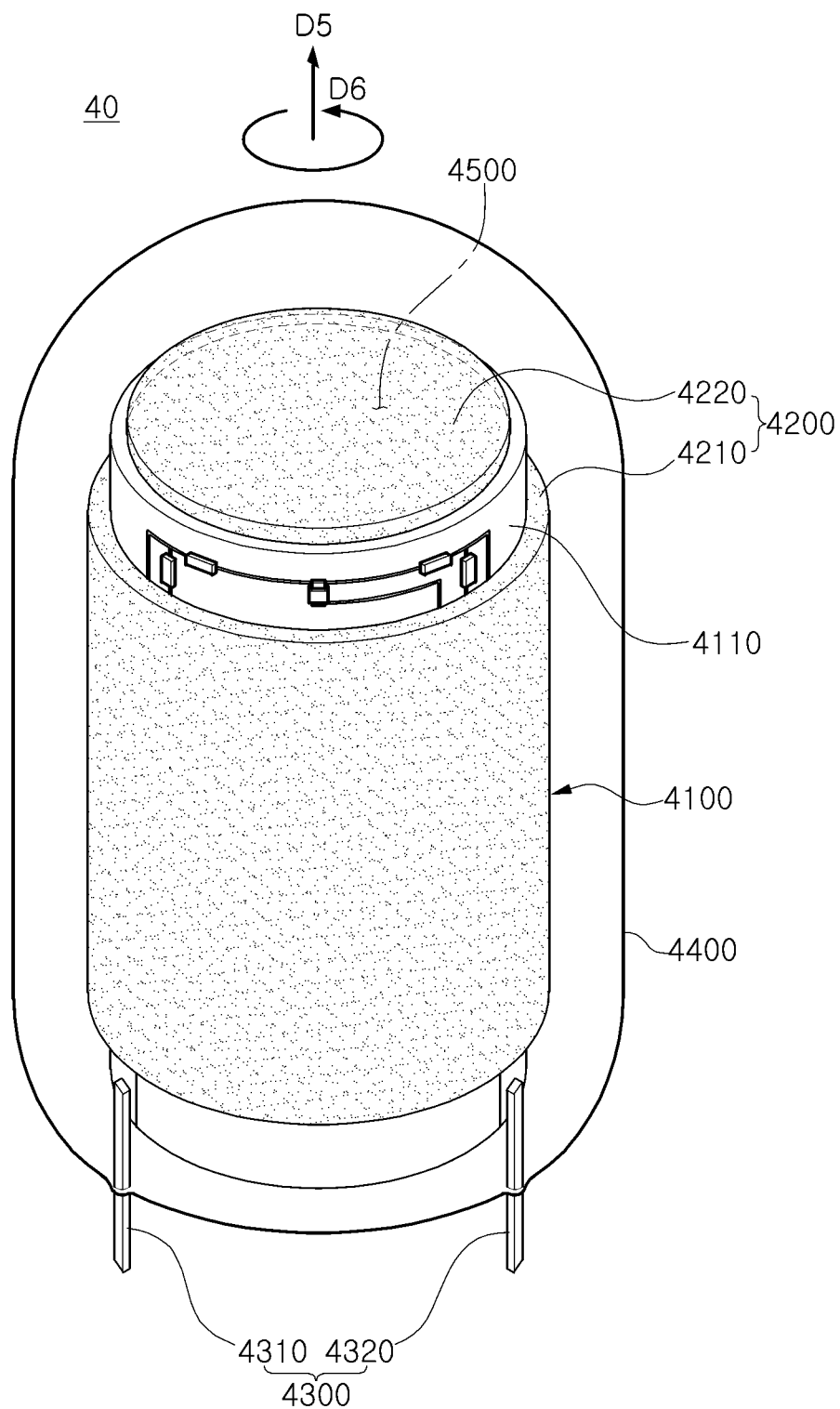
Figure 13:
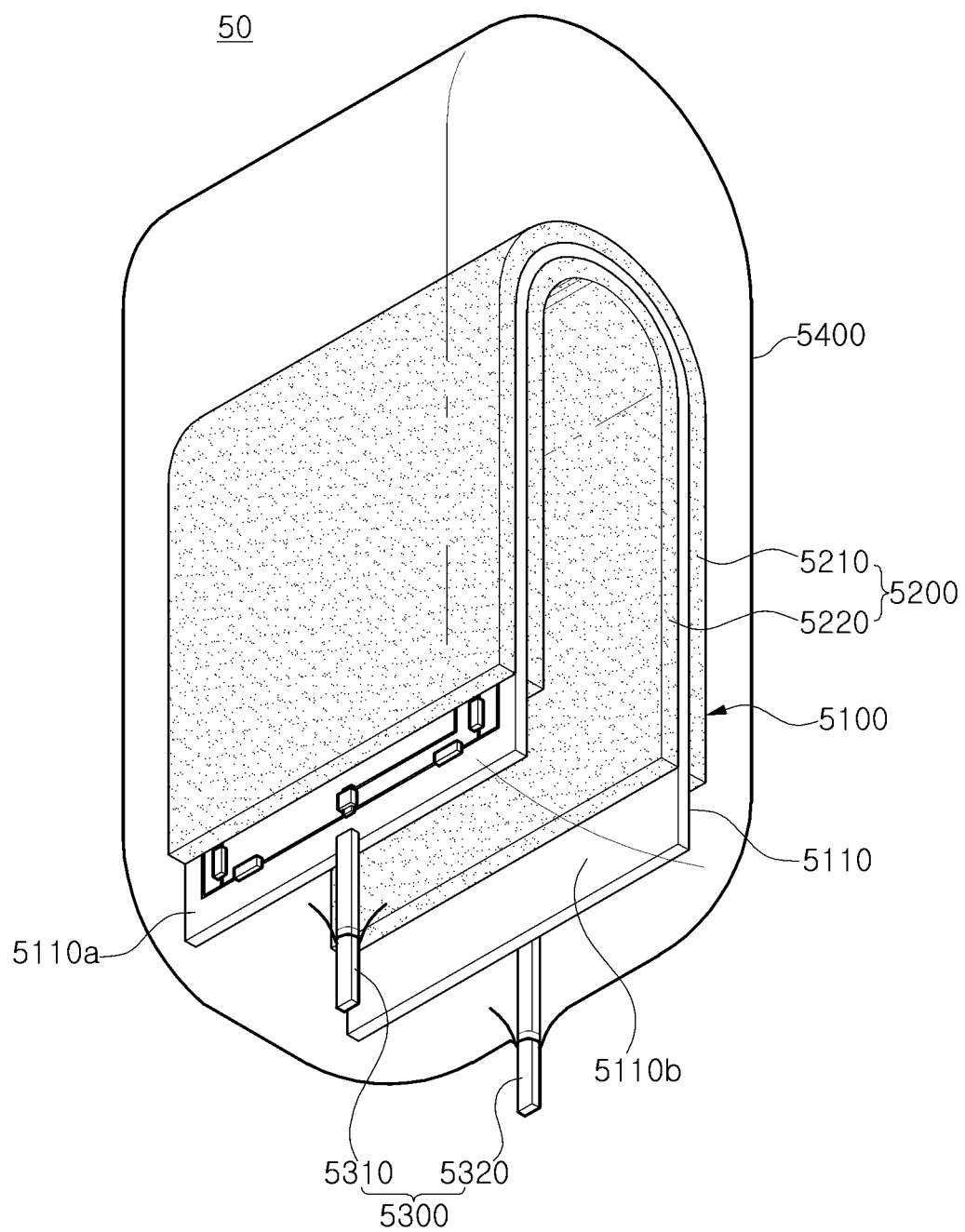

FIGS. 11 to 13 are modified examples of an LED lamp 10 of FIG. 1.

An LED lamp 30 of FIG. 11 is different from the LED lamp 10 in the above-described example embodiment in that a flexible transparent substrate 3110 is employed and the transparent substrate 3110 is bent in a direction D4 surrounding a central axis D3 disposed in a longitudinal direction of the LED lamp 30. In addition, unlike the example embodiment, an LED device 3100 is sealed not by a bulb but by a light transmissive mold 3400.

Thus, a transparent substrate 3110 may be bent in a cylindrical shape to be disposed, a first wavelength converter 3210 of wavelength converters 3200 may be disposed on an outer surface of the transparent substrate 3110 bent in the cylindrical shape, and a second wavelength converter 3200 may be an inner surface of the transparent substrate 3110 bent in the cylindrical shape. By disposing the transparent substrate 3110 in the cylindrical shape, a light directing angle may be extended as compared with the example embodiment in which the transparent substrate 3110 is disposed in a plate shape. In addition, according to example embodiments, accessories of the LED lamp 30 may be disposed in an internal space 3500 of the cylinder formed by the transparent substrate 3110.

The light transmissive mold 3400 is formed by molding a light transmissive resin on a surface of the LED device 3100.

By applying the light transmissive resin and curing it in a state the transparent substrate 3110 is bent, the light transmissive mold 3400 may be fixed in a state in which the transparent substrate 3110 is bent.

Since the point that a connection terminal 3300 includes first and second connection terminals 3310 and 3320 and are disposed at one end of the transparent substrate 3110 is the same as above-described example embodiment, and a detailed description thereof will be omitted.

FIG. 12 is different from the LED lamp 30 of the modified example of FIG. 11 in that a flexible transparent substrate 4110 is attached to a cylindrical light transmissive column 4500 and a second wavelength converter 4220 is disposed on an upper portion of the light transmissive column 4500. Since the transparent substrate 4110 is attached to the light transmissive column 4500 to form a mold 4400 in a bent state, manufacturing is easier than a modified example described above.

The transparent substrate 4110 is bent in a direction D6 surrounding a central axis D5 disposed in a longitudinal direction of an LED lamp 40, the same as the above-described modified example. In addition, since the point that a connection terminal 4300 includes first and second connection terminals 4310 and 4320 and is disposed at one end of the transparent substrate 4110 is the same as the above-described example embodiment, a detailed description thereof will be omitted.

FIG. 13 is different from the LED lamp 10 of the above-described example embodiment in that a flexible transparent substrate 5110 is bent in a U-type, and first and second connection terminals 5310 and 5320 are respectively disposed at both ends 5110a and 5110b of the transparent substrate 5110, respectively. Since the point that a connection terminal 5300 includes the first and second connection terminals 5310 and 5320 is the same as the above-described example embodiment, a detailed description thereof will be omitted.

As set forth above, according to example embodiments, an LED device and an LED lamp using the same may reduce manufacturing costs.

While example embodiments have been shown and described above, it will be apparent to those skilled in the art that modifications and variations could be made without departing from the scope of the inventive concept as defined by the appended claims.

What is claimed is:

1. A light emitting diode (LED) device comprising:
   a transparent substrate comprising:
      a first surface, and
      a second surface opposite to the first surface;
   an LED array disposed on at least one of the first surface and the second surface of the transparent substrate, and comprising a plurality of LED chips electrically connected to one another;
   a controller disposed on at least one of the first surface and the second surface, and is electrically connected to the LED array to control the LED array;
   a connection terminal disposed at a first end of the transparent substrate, and electrically connected to the LED array and the controller; and
   a wavelength converter covering the first surface and the second surface of the transparent substrate and the LED array,
   wherein the wavelength converter is disposed to cover only the LED array among the LED array and the controller.

2. The LED device according to claim 1, wherein the plurality of LED chips are electrically connected by a printed circuit formed of a transparent conductive material.

3. The LED device according to claim 1, wherein the LED array is disposed on each of the first surface and the second surface of the transparent substrate.

4. The LED device according to claim 1, wherein a side surface of the transparent substrate comprises a concave-convex pattern.

5. The LED device according to claim 1, wherein the controller is disposed at a second end opposite to the first end of the transparent substrate.

6. The LED device according to claim 1, wherein the controller comprises a semiconductor chip constituting an alternating current to direct current (AC/DC) rectifier circuit.

7. The LED device according to claim 6, wherein a surface of the semiconductor chip is provided with a reflective layer.

8. The LED device according to claim 6, wherein the semiconductor chip is attached to the transparent substrate by a light transmissive bonding layer.

9. The LED device according to claim 1, wherein the transparent substrate is a flexible substrate.

10. The LED device according to claim 9, wherein the transparent substrate is bent such that the at least one of the first surface and the second surface is exposed.

11. The LED device according to claim 10, wherein the transparent substrate is bent based on a central axis in which the first surface connects the first end and a second end opposite to the first end of the transparent substrate.

12. The LED device according to claim 11, further comprising a light transmissive column disposed on the central axis, and the transparent substrate is attached to surround the light transmissive column.

13. The LED device according to claim 1, wherein the plurality of LED chips are electrically connected in series.

14. A light emitting diode (LED) lamp comprising:
   a bulb having an internal space; and
   at least one LED device disposed in the internal space and comprising:
      a transparent substrate comprising a first surface and a second surface opposite to the first surface;
      an LED array disposed on at least one of the first surface and the second surface of the transparent substrate, and comprising a plurality of LED chips electrically connected to one another;
      a controller disposed on the least one of the first surface and the second surface and electrically connected to the LED array to control the LED array;
      a connection terminal disposed at at least one end of the transparent substrate and electrically connected to the LED array and the controller, wherein at least a portion of the connection terminal is exposed to an exterior of the bulb; and
      a wavelength converter covering the first surface and the second surface of the transparent substrate and the LED array.

15. The LED lamp according to claim 14, wherein the internal space is filled with at least one of helium gas and oxygen gas.

16. The LED lamp according to claim 14, wherein the wavelength converter has a sheet-shape.

17. The LED lamp according to claim 14, wherein the wavelength converter is extended to cover a side surface disposed between the first surface and the second surface of the transparent substrate.

18. The LED lamp according to claim 14, wherein an inner side of the bulb is frosted.

19. A light emitting diode (LED) lamp comprising:
at least one LED device; and
a light transmissive mold sealing the LED device,
wherein the at least one LED device comprises:
- a bent transparent substrate comprising:
  - a first surface; and
  - a second surface opposite to the first surface;
- an LED array disposed on at least one of the first surface and the second surface of the transparent substrate, and comprising a plurality of LED chips electrically connected to each other;
- a controller disposed on the at least one of the first surface and the second surface, and is electrically connected to the LEI) array to control the LED array;
- a connection terminal disposed at least one end of the transparent substrate, and electrically connected to the LED array and the controller, wherein at least a portion of the connection terminal is exposed to an exterior of the light transmissive mold; and
- a wavelength converter covering the first surface and the second surface of the transparent substrate and the LED array.

20. The LED lamp according to claim 19, wherein the bent transparent substrate is bent such that the at least one of the first surface and the second surface including the LED array is exposed.

* * * * *